(12) United States Patent
Lysacek et al.

(10) Patent No.: US 8,846,500 B2
(45) Date of Patent: Sep. 30, 2014

(54) METHOD OF FORMING A GETTERING STRUCTURE HAVING REDUCED WARPAGE AND GETTERING A SEMICONDUCTOR WAFER THEREWITH

(75) Inventors: David Lysacek, Zasova (CZ); Jana Vojtechovska, Roznov Pod Radhostem (CZ); Lubomir Dornak, Roznov Pod Radhostem (CZ); Petr Kostelnik, Frenstat Pod Radhostem (CZ); Lukas Valek, Stritez Nad Becvou (CZ); Petr Panek, Zasova (CZ)

(73) Assignee: Semiconductor Components Industries, LLC, Phoenix, AZ (US)

( * ) Notice: Subject to any disclaimer, the term of this patent is extended or adjusted under 35 U.S.C. 154(b) by 798 days.

(21) Appl. No.: 12/966,530

(22) Filed: Dec. 13, 2010

(65) Prior Publication Data

US 2012/0146024 A1 Jun. 14, 2012

(51) Int. Cl.
*H01L 21/322* (2006.01)
*H01L 29/66* (2006.01)
*H01L 33/16* (2010.01)

(52) U.S. Cl.
CPC ...... *H01L 21/3221* (2013.01); *H01L 29/66272* (2013.01)
USPC ........... 438/471; 438/310; 438/402; 438/457; 438/476; 257/E23.137; 257/E21.318

(58) Field of Classification Search
CPC ......... H01L 21/3221; H01L 21/3225–21/3226
USPC ........... 438/58, 143, 310, 402, 457, 471–478; 257/E21.318, E29.108, E23.137
See application file for complete search history.

(56) References Cited

U.S. PATENT DOCUMENTS

| | | | |
|---|---|---|---|
| 3,856,647 A | 12/1974 | Blachman | |
| 4,053,335 A | 10/1977 | Hu | |
| 4,742,020 A | 5/1988 | Roy | |
| 4,897,360 A | 1/1990 | Gucket et al. | |
| 5,539,245 A | 7/1996 | Imura et al. | |
| 5,753,134 A | 5/1998 | Biebl | |
| 5,757,063 A * | 5/1998 | Tomita et al. ................. | 257/610 |
| 5,801,084 A * | 9/1998 | Beasom et al. .............. | 438/457 |
| 5,863,659 A | 1/1999 | Kobayashi et al. | |
| 5,970,365 A | 10/1999 | Takamizawa et al. | |
| 6,479,166 B1 | 11/2002 | Heuer et al. | |
| 2002/0157597 A1* | 10/2002 | Takeno ............................ | 117/4 |
| 2004/0241946 A1 | 12/2004 | Kim et al. | |
| 2005/0239267 A1* | 10/2005 | Tobashi ........................ | 438/455 |
| 2007/0065671 A1* | 3/2007 | Li ................................ | 428/446 |
| 2008/0197454 A1* | 8/2008 | Rakotoniana et al. ........ | 257/617 |
| 2009/0261337 A1 | 10/2009 | Sakakura et al. | |
| 2010/0041175 A1* | 2/2010 | Dubois et al. .................. | 438/58 |
| 2010/0155736 A1* | 6/2010 | Yoon et al. ...................... | 257/72 |
| 2011/0068480 A1* | 3/2011 | Hayashi et al. ............... | 257/777 |

OTHER PUBLICATIONS

"A New Technique for Producing Large-Area As-Deposited Zero-Stress LPCVD Polysilicon Films: The MultiPoly Process," Jie Yang, Harold Kahn, An-Qiang He, Stephen M. Phillips, Arthur H. Heuer, IEEE, vol. 9, No. 4, Dec. 2000.*

"Characterization of Residual Stress in Microelectromechanical Systems (MEMS) Devices Using Raman Spectroscopy", LaVern A. Starman, Department of the Air Force, 2002.*

* cited by examiner

*Primary Examiner* — Laura Menz
*Assistant Examiner* — Maliheh Malek
(74) *Attorney, Agent, or Firm* — Kevin B. Jackson (57) ABSTRACT

At least one exemplary embodiment is directed to a method of forming a multilayered gettering structure that can be used to control wafer warpage.

16 Claims, 4 Drawing Sheets

METHOD OF FORMING A GETTERING STRUCTURE HAVING REDUCED WARPAGE AND GETTERING A SEMICONDUCTOR WAFER THEREWITH

FIELD OF THE INVENTION

The present invention relates in general, to electronics, and more particularly though not exclusively, to semiconductors, structures thereof, and methods of forming semiconductor devices.

BACKGROUND OF THE INVENTION

Increasing the circuit density on silicon wafers requires increasing cleanliness and purity on the device side of the wafer (device active region). Increased purity is obtained by forming collection sites (gettering sites) outside the device active region. The process of forming the collection sites is called gettering.

Gettering is divided into two types, internal gettering and external gettering. Internal gettering is achieved by forming gettering sites in the bulk of the wafer, while external gettering is characterized by forming gettering sites at the back surface of the wafer. External gettering can be divided based upon the methodology of gettering site formation for example sandblasting, polysilicon film deposition, laser damage, ion implantation and phosphorus diffusion. One side effect of using external gettering can be increased wafer warpage caused by the stress induced by the polysilicon film (residual stress).

Wafer warpage causes improper focusing during lithography. To increase purity on the device side of the wafer a gettering layer seeks to obtain a high crystal defect density (gettering sites), which unfortunately increase residual stress and promotes wafer warpage. When the front surface is mirror polished and the polysilicon film is left on the back surface only, the front warps in a concave (convex) form for a compressive (tensile) stress induced by the gettering layer.

Accordingly, it is desirable to have a method of external gettering that reduces the effect of warpage on a wafer and/or controls the warpage of a wafer.

BRIEF DESCRIPTION OF THE DRAWINGS

Exemplary embodiments of present invention will become more fully understood from the detailed description and the accompanying drawings, wherein.

DETAILED DESCRIPTION

At least one exemplary embodiment is directed to a method of forming a multilayered gettering system that can be structured to reduce or increase wafer warpage by a designed amount.

The following description of exemplary embodiment(s) is merely illustrative in nature and is in no way intended to limit the invention, its application, or uses.

For simplicity and clarity of the illustration(s), elements in the figures are not necessarily to scale, are only schematic and are non-limiting, and the same reference numbers in different figures denote the same elements, unless stated otherwise. Additionally, descriptions and details of well-known steps and elements are omitted for simplicity of the description.

It will be appreciated by those skilled in the art that the words "during", "while", and "when" as used herein relating to circuit operation are not exact terms that mean an action takes place instantly upon an initiating action but that there may be some small but reasonable delay, such as a propagation delay, between the reaction that is initiated by the initial action. Additionally, the term "while" means that a certain action occurs at least within some portion of duration of the initiating action. The use of the word "approximately" or "substantially" means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described.

The terms "first", "second", "third" and the like in the Claims or/and in the Detailed Description are used for distinguishing between similar elements and not necessarily for describing a sequence, either temporally, spatially, in ranking or in any other manner. It is to be understood that the terms so used are interchangeable under appropriate circumstances and that the exemplary embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, if the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

Processes, techniques, apparatus, and materials as known by one of ordinary skill in the art may not be discussed in detail but are intended to be part of the enabling description where appropriate. For example specific methods of semiconductor doping or etching may not be listed for achieving each of the steps discussed, however one of ordinary skill would be able, without undo experimentation, to establish the steps using the enabling disclosure herein. Such processes, techniques, apparatus, and materials are intended to fall within the scope of at least one exemplary embodiment.

Notice that similar reference numerals and letters refer to similar items in the following figures, and thus once an item is defined in one figure, it may not be discussed or further defined in the following figures.

Figure 1:
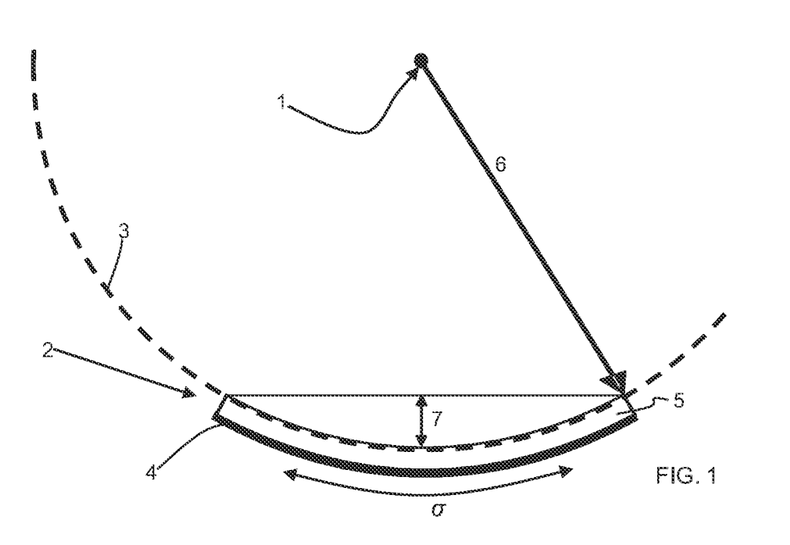
FIG. 1 illustrates a schematic used to define the warpage of a wafer.

The term warpage is used herein to refer to the bending of a wafer from an ideal horizontal shape. FIG. 1 illustrates one non-limiting method of defining a value (warp value) of the warpage of a wafer 2. The Warp value 7 (w) is given by:

$w = D^2/8R$, where D is the diameter of the wafer 2, and where R is the radius of curvature 6 from the center 1 of a circle 3 that tangentially intersects the warped wafer 2. The stress ($\sigma$) of the gettering layer(s) 4 warp the gettering layer(s) 4 and the wafer 5 upon which the gettering layer(s) 4 are deposited.

The residual (final) stress ($\sigma_f$) of the wafer can be expressed as:

$\sigma_f = (E/(6(1-v))) \cdot (t_s^2/t_f) \cdot (1/R - 1/R_0)$, where E is Young's modulus, v is Poisson's ratio, $t_s$ is the thickness of the wafer 5, $t_f$ is the thickness of the gettering layer(s) 4, R is the radius of curvature 6 of the wafer with the gettering layer(s) 4, and $R_0$ is the radius of curvature of the wafer prior to deposition of the gettering layer(s) 4 (Freund L.B., Suresh S.: Thin Film Materials, Cambridge University Press, 2003).

Another measure of curvature of the wafer 2 is called the bow value. Test methods for the warp value and bow value are described by standard industry references, for example for the warp, MF1390, Test Method for Measuring Warp on Silicon Wafers by Automated Non-Contact Scanning, Semiconductor Equipment and Materials International (SEMI) 2007, and for the bow value, MF534, Standard Test Method for Bow of Silicon Wafers, Semiconductor Equipment and Materials International (SEMI) 2007.

Silicon wafers may be produced with a variety of modifications (e.g. crystallographic orientation; diameter; thickness; concentration of doping elements; concentration of other impurities (e.g. oxygen, nitrogen, carbon, and germanium); concentration of crystallographic defects of various types; presence and properties of the epitaxial layer, various manufacturing processes). All such modifications may lead to various changes of the mechanical properties of the silicon wafer, which may lead to various extent of the warpage induced by the polysilicon layer.

Figure 2:
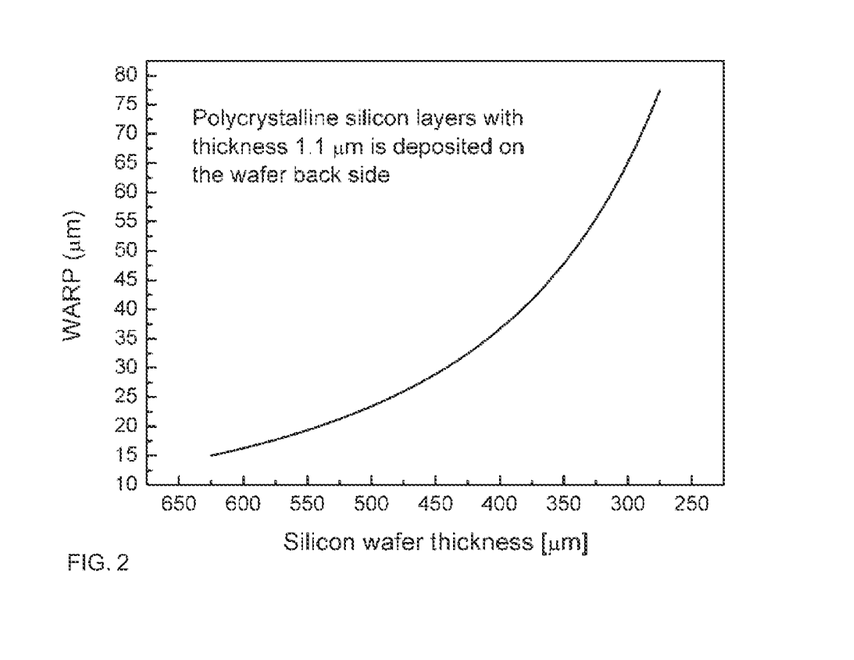
FIG. 2 illustrates the effect of wafer thickness on warpage.

The problem of polysilicon layer (also referred to as polycrystalline silicon layer) induced warpage is nowadays even more apparent because of economical need of using of thinner substrates (from 625 µm to 525 µm and even to 380 µm in case of the six inch silicon wafers). This is caused by the higher influence of the polysilicon layer on the warpage with decreasing wafer thickness, which may lead to complete inability of producing wafers with backside polysilicon layer with warpage fulfilling the demanded specification. FIG. 2 illustrates the effect of a 1.1 µm thick layer deposited on silicon wafers of various thicknesses. As illustrated the warp amount in µm increases from about 15 µm for a silicon wafer of 625 µm thickness to about 46 µm for a silicon wafer of 380 µm thickness. Thus a wafer thickness of 380 µm has roughly three times the warpage of a wafer of thickness 625 µm for the same 1.1 µm thick polycrystalline silicon gettering layer.

Figure 3:
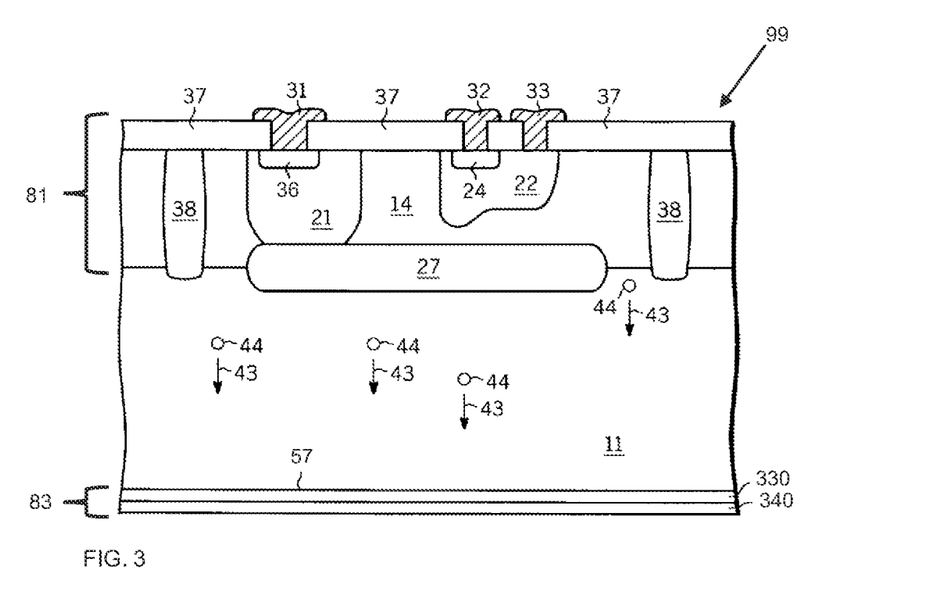
FIG. 3 illustrates an enlarged partial cross-sectional view of a semiconductor device manufactured in accordance with at least one exemplary embodiment.

FIG. 3 illustrates an enlarged partial cross-sectional view of a semiconductor device 99 manufactured in accordance with at least one exemplary embodiment. Device 99 can include an active portion 81, which can be formed in a semiconductor layer 14 overlying a semiconductor substrate 11. In the non-limiting example illustrated in FIG. 1 the semiconductor device 99 comprises a NPN bipolar transistor device, and includes a n-type collector region 21, a p-type base region 22, and a n-type emitter region 24. An n-type buried layer 27 is formed adjacent semiconductor substrate 11 and semiconductor layer 14, and functions to reduce resistance between the base region 22 and the collector region 21. An n-type collector region 36 is formed within the collector region 21, and functions to reduce contact resistance to collector contact 31. Emitter contact 32 and base contact 33 contact emitter region 24 and base region 22 respectively. A dielectric layer 37 is formed overlying portions of major surface 16, and p-type diffused isolation region 38 are formed in portions of semiconductor layer 14 to provide isolation for active device portion 81. Note that FIG. 1 illustrates a non-limiting example of a NPN transistor formed using gettering structure 83 comprising gettering layers 330 and 340. Other devices can be formed using the gettering structure 83 or other exemplary embodiments, for example the device(s) can be MOSFETS, IGFETS, diodes, thyristors, PNP bipolar devices, and other semiconductor devices that can be formed in semiconductor layer 14 as know by one of ordinary skill in the art of semiconductor device formation. In summary the method(s)/device(s) described herein can be used in the formation of any device where gettering and/or the reduction of the formation of impurity related defects are useful in device formation.

A multi-layer gettering or extrinsic composite gettering structure 83 is formed on a lower, back side, or major surface 57 of semiconductor substrate 11. In at least one exemplary embodiment the multi-layer gettering structure 83 includes an initial amorphous layer 330 and a polycrystalline semiconductor layer 340. In at least one non-limiting example the polycrystalline semiconductor layer 340 can include polycrystalline silicon or polysilicon, and the initial amorphous layer 330 can include amorphous silicon which crystallizes during deposition of the polycrystalline semiconductor layer 340.

In at least one exemplary embodiment, structure 83 is formed at an early stage of wafer fabrication, for example prior to any high temperature processing (i.e., before any processing above about 900 degrees Celsius or annealing). It is understood that device 99 is shown as an intermediate structure because multi-layer structure 83 can be removed from semiconductor substrate 11 at a final stage of fabrication. In another exemplary embodiment, multi-layer structure 83 remains in the final device.

As shown in FIG. 3, structure 83 functions to getter (designated generally by arrows 43) unwanted impurities 44 including, but not limited to heavy metals such as copper, nickel, and/or iron. The gettering effect of polycrystalline semiconductor layer 340 is explained in part because the solubility of heavy metals in polycrystalline semiconductor layer 340 at high temperature (greater than about 1000 degrees Celsius) is generally more than an order of magnitude higher than the solubility of the heavy metals in single crystalline silicon substrate 11.

In at least one exemplary embodiment multi-layer structure 83 is formed using for example, CVD or low pressure chemical vapor deposition (LPCVD) techniques or other techniques as known by one of ordinary skill in semiconductor formation. Polycrystalline silicon is formed for example using silane by the reaction:

$SiH_4 \rightarrow Si + 2H_2$.

Layers can be deposited and formed via numerous processes, for example Chemical vapor deposition (CVD). Chemical vapor deposition (CVD) or thermal CVD is the deposition of atoms or molecules from a chemical vapor precursor, which contains the film material to be deposited. Chemical vapor precursors include chlorides such as titanium tetrachloride, $TiCl_4$; fluorides such as tungsten hexafluoride, $WF_6$; hydrides such as silane, $SiH_4$; carbonyls such as nickel carbonyl, $Ni(CO)_4$; and many others. Besides silane ($SiH_4$), polysilicon layers can be produced by CVD of dichlorosilane ($SiH2Cl_2$), trichlorosilane ($SiHCl_3$), or silicon tetrachloride ($SiCl_4$). Any of these gases can be used alone or with hydrogen or other carrier gas. Decomposition of the vapor can be accomplished by chemical reduction or thermal decomposition. The reduction is normally accomplished by hydrogen at an elevated temperature. Some vapors, such as the carbonyls, can be thermally decomposed at relatively low temperatures. The deposited material may react with gaseous species such as oxygen, with a hydrocarbon gas such as methane or ammonia, or with a codeposited species to give compounds such as oxides, nitrides, carbides, and borides. One such CVD chemical reaction is that of silane: This is a decomposition reaction. For example an amorphous silicon layer can be deposited from about 530° C. to 585° C. with a pressure from about 100 mTorr to about 300 mTorr. Note that the layers (e.g., polycrystalline silicon and amorphous silicon layers) in accordance to at least one exemplary embodiment can be formed with pressures in the range of about 10 mTorr to about 760 mTorr and deposition temperatures from about 400° C. to about 700° C. and at various gas rates, for example silane flow rates from 50 sccm to 400 sccm. Note that other values of pressures and temperatures can be used in accordance with other exemplary embodiments, however the efficiency of formation of the layers is reduced.

CVD reactions can also be produced at ambient pressure (APCVD) in a freely flowing system. The gas flow, mixing, and stratification in the reactor chamber can be important to the deposition process. CVD can also be performed at low pressures (LPCVD) and in ultrahigh vacuum (UHVCVD) where the gas flow is molecular. The gas flow in a CVD reactor is very sensitive to reactor design, fixturing, substrate geometry, and the distance between two adjacent wafers.

The CVD process is accomplished using either a hot-wall or a cold-wall reactor as known in the art. In the former, the whole chamber is heated and thus a large volume of processing gases is heated as well as the substrate. In the latter, the substrate or substrate fixture is heated, often by inductive heating. This heats the gas locally.

The gas flow over the substrate surface establishes a boundary layer across which precursor species can diffuse in order to reach the surface and deposit. In the cold-wall reactor configuration, the boundary layer defines the temperature gradient in the vapor in the vicinity of the substrate. This boundary layer can vary in thickness and turbulence, depending on the direction and velocity of gas flow. Direct impingement of the gas on the surface reduces the boundary layer thickness and increases the temperature gradient, whereas stagnant flow regions give much thicker boundary layers.

The microstructure and crystallographic texture of polysilicon deposited by LPCVD (usually involving the thermal decomposition of silane) is determined mainly by the deposition temperature and the partial pressure of the reactant gases (e.g. silane) and to a lesser extent the presence of hydrogen carrier gas.

Silicon wafers are used as substrates for manufacturing semiconductor devices. Layer of polycrystalline silicon is often formed on the back side of the silicon wafer to reduce the chance of the occurrence of metallic impurities in the silicon wafer and especially near, or even on, the front surface of the silicon wafer. The front surface of the wafer is most often mirror polished or contains an epitaxial layer.

The polycrystalline silicon layer (hereafter called the polysilicon layer) is formed on the silicon wafer prior its use as the substrate for manufacturing of semiconductor devices. Stress induced by the polysilicon layer may cause warpage of the silicon wafer, which may be even more increase by the further deposition of low temperature oxide (used on typically 25% of produced wafers). The warpage may forbid processing of the silicon wafer in wafer fab on process steps such as photolithography and dry plasma etching. For example, the high warpage of the wafer may cause imperfect placement on the mechanical clamp chuck used in the plasma etchers and inflict venting of the processing atmosphere and imperfect etching of the deep trenches. Such problems lead to scrapping of such wafers. Scrapped wafers cause financial loss to the manufacturer of semiconductor devices.

Figure 4:
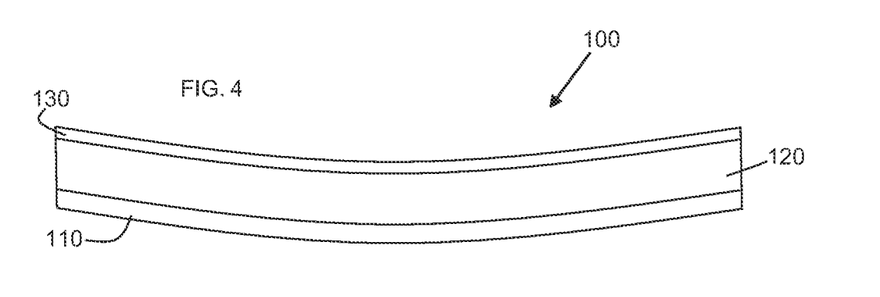
FIG. 4 illustrates the warpage of a wafer due to compressive stress.

FIG. 4 illustrates the warpage effect on a wafer 100 that can occur because of the deposition of a layer 110 (eg. a polysilicon gettering layer) on substrate 120. As illustrated a polysilicon gettering layer exhibits compressive stresses warping the wafer 100. As illustrated in FIG. 4, the wafer 100 can include optional epitaxial layers 130, which also warps as part of the wafer 100. Multiple layers of polysilicon, for example multiple layers deposited upon layer 110, each, which can have the same direction of stress (e.g., both having compressive stresses) do not change the direction of stress to tensile stress, and thus cannot completely control the warpage of the wafer 100. Polycrystalline silicon layer is a non-limiting example of a layer that contributes a compressive stress to a wafer when deposited on the backside of a substrate. Other layers as known by one of ordinary skill in the art can be used in the description herein and the discussions of specific materials for the compressive and tensile stress layers should not be interpreted as limitative of the scope of exemplary embodiments. For example amorphous silicon can contribute a tensile stress layer to a wafer, however other materials as known by one of ordinary skill in the art can be used as well. In the following non-limiting discussion of enabling examples polycrystalline silicon will be used as an non-limiting example of a compressive stress contributor and crystallized amorphous silicon as an non-limiting example of a tensile stress contributor.

Figure 5:
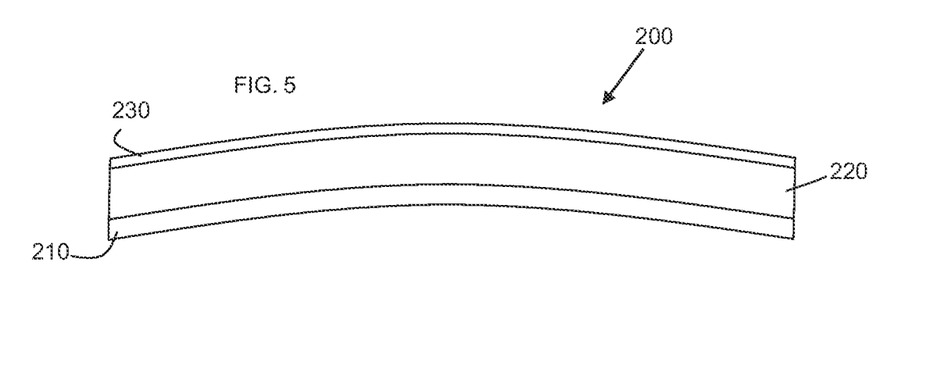
FIG. 5 illustrates the warpage of a wafer due to tensile stress.

FIG. 5 illustrates a wafer 200 that is warped in an opposite direction than the wafer 100 illustrated in FIG. 4. The warpage of the wafer 200 is due to a layer 210 that exhibits tensile stress. Note that the wafer 200 is shown with an optional epitaxial layer 230. Several layers exhibit tensile stress. For example an amorphous silicon layer will exhibit tensile stress depending upon the deposition temperature and pressure. For example an amorphous layer deposited can exert a tensile stress when later layer(s) of polycrystalline are deposited onto of the amorphous layer at a higher temperature than the deposit temperature of the amorphous layer. The amorphous layer can crystallize becoming polycrystalline changing its stress level so as to exert a tensile stress. Note that description of non-limiting examples will discuss deposition of an amorphous silicon layer, which can have a compressive stress whose stress changes to a tensile stress value upon crystallization when a higher temperature of polycrystalline silicon layer is deposited on top of the amorphous silicon layer, however such description should not be interpreted to be limited of the material or processes used to form a layer that exerts a tensile stress. Any layer of material that provides tensile stress can be used provided that the multilayer exhibits proper gettering function. Comparison of the warpage shown in FIG. 4 and FIG. 5 illustrates that if one controls the level of tensile and compressive stress of deposited layers the warpage of the wafer can be controlled within a desired level.

Figure 6:
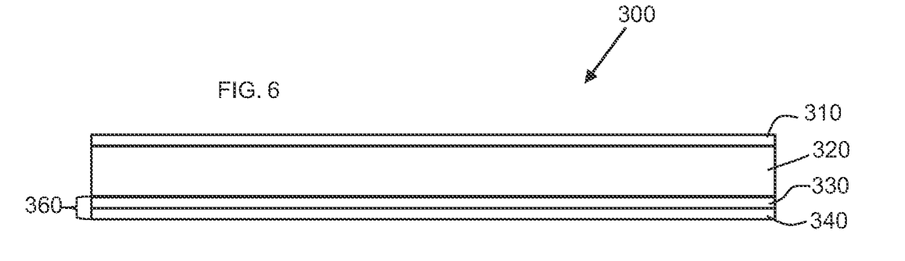
FIG. 6 illustrates the warpage of a wafer due to gettering structure of at least one exemplary embodiment.

FIG. 6 illustrates a gettering structure 360 (e.g., multiple layers with cumulative gettering capability) in accordance with at least one exemplary embodiment. A first layer 330 (e.g., an amorphous silicon layer) is deposited on the back of a substrate 320 (e.g., silicon substrate) with an optional epitaxial layer 310. The second layer 340 (e.g., polycrystalline silicon layer) can be deposited on top of the first layer 330. The resultant gettering structure 360 (the first layer 330 and the second layer 340) can result in a residual stress value that is less than the residual stress level due to a similar thickness polycrystalline layer deposited onto the back of substrate 320. FIG. 6 illustrates one of many possible results of the residual stress values of the gettering structure 360, where the warpage of the wafer 300 is near zero. The residual stress can be positive, negative or near zero and partly depends upon the relative thickness of the two layers. Note that although two layers are illustrated in FIG. 6, multiple layers can be used.

Figure 7:
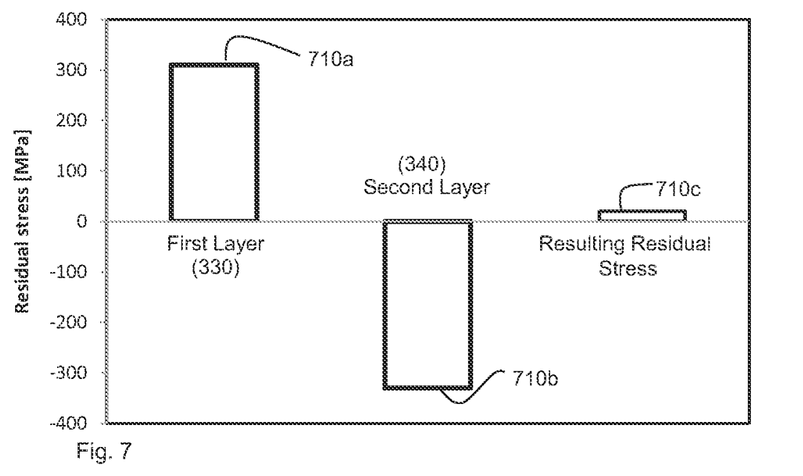
FIG. 7 illustrates the relationship between sub-layer stresses and residual stress.

FIG. 7 illustrates a non-limiting example where the first layer 330 has a tensile stress value 710a that is larger than the second layer's 340 compressive stress value 710b resulting in a residual stress value 710c that is net tensile. Note that the individual stress values (710a and 710b) can be varied in accordance with the thickness of each layer and deposition conditions of each layer (especially deposition temperature and deposition pressure). Note that the ability to control the warpage of a wafer facilitates repair of wafers to obtain near zero warpage. For example if a wafer is provided that has layers that result in a net compressive stress and warpage associated with the compressive stress, a first layer 330 and a second layer 340 can be deposited to controlled thicknesses (deposition rate, temperature and pressure) so that the net added gettering structure has a net residual stress that is tensile so that the gettering structure counteracts the initial warpage, reducing the total warpage. The process can also be applied to pre device formation, controlling the warpage of the wafer prior to etching. Thus at least one exemplary embodiment can be used in multiple semiconductor device formation (e.g., IGBT, Trench IGBT, HVFET, HFVR, TMOS, CMOS, VHVIC, MOSAIC, High Speed Logic, Small Signal Shottky, and other semiconductor devices as known by one of ordinary skill in semiconductor device formation).

Figure 8:
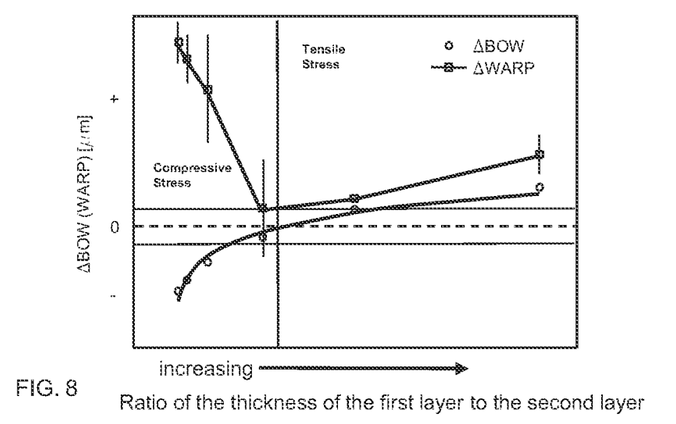
FIG. 8 illustrates the relationship between the ratio of thicknesses of sub-layers of a gettering structure of at least one exemplary embodiment and the warpage of a wafer.

FIG. 8 illustrates the residual stress of wafer (e.g., 300) as a function of the ratio of the first layer 330 thickness to the second layer 340 thickness. As illustrated the residual stress can vary from a compressive stress value at ratio values below about 0.5, to tensile stress values at and above a ratio value of about 0.5. The thickness of each individual layer can vary, for example the polycrystalline silicon layer can be from 0.001 microns to 10 microns.

Figure 9A:
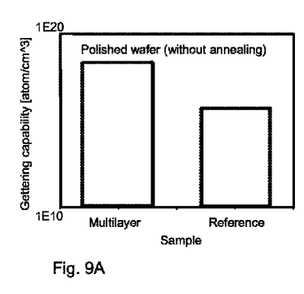
FIG. 9A illustrates a comparison of the gettering capability of a gettering structure of at least one exemplary embodiment and a reference gettering layer of polysilicon.
Figure 9B:
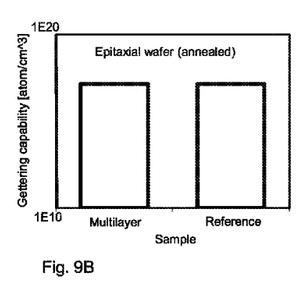
FIG. 9B illustrates a comparison of the gettering capability of a gettering structure of at least one exemplary embodiment after annealing of the wafer and a reference gettering layer of polysilicon after high temperature annealing.

FIG. 9A and FIG. 9B illustrate the gettering capability of a gettering structure 360 prior to annealing (FIG. 9A) and after annealing (FIG. 9B) illustrating that the gettering capability of the multilayer gettering structure is equivalent to a reference gettering capability level, where the reference gettering capability level is the gettering capability of a similar thickness polysilicon gettering layer. The gettering capability of the polysilicon gettering layer can be measured e.g. by the method of controlled contamination (MCC). The method is based on intentional contamination of the mirror polished wafer front surface by metal atoms (nickel being the most suitable for these purposes) e.g. from a droplet of aqueous solution of the metal salt, annealing of the wafer by a proper thermal treatment (e.g. 900° C./10 min), cooling to the room temperature, selective etching of the wafer front surface (e.g. in Wright etchant/1 min) and evaluation of the quality of the wafer front surface. If the gettering capability of the wafer with the gettering layer on its back side is sufficient for a given surface concentration of the metallic contamination, the wafer front surface remains mirror-like after selective etching. If the gettering capability of the wafer with the gettering layer on its back side is insufficient for given surface concentration of the metallic contamination, the wafer front surface appears matted after selective etching (this is called "haze"). The highest surface concentration of the metallic contamination which is absorbed by the wafer with the gettering layer without formation of the hazy front surface is the gettering capability of the wafer with the deposited layer (e.g. polysilicon layer). If the intrinsic gettering capability of the wafer is negligible, the measured gettering capability is the gettering capability of the gettering layer.

FIG. 9A illustrates the gettering capability of a gettering structure 360 in accordance with at least one exemplary embodiment which provides a gettering capability 910a that is larger than the gettering capability 910b of a reference polysilicon gettering layer of similar thickness. FIG. 9B illustrates the gettering capability of gettering structure 360 after high temperature processing (e.g., annealing) where the gettering capability 920a after high temperature processing for the gettering structure 360 is about the value of the gettering capability 920b of the reference polysilicon gettering layer. Thus in at least one exemplary embodiment the warpage of the wafer 300 can be controlled by the relative thickness of the first layer 330 and second layer 340, while maintaining a equivalent gettering capability of the gettering structure 360 (when compared to a getter polysilicon layer of similar thickness).

Polycrystalline silicon exposed to a thermal treatment, especially a high temperature thermal treatment, undergoes a process of recrystallization. Such recrystallization process takes place also in the gettering polycrystalline silicon layers during processing of a silicon wafer comprising a polysilicon gettering layer during fabrication of electronic devices. The recrystallization process can result in degradation of the gettering capability of the gettering layer and/or to change in the residual stress induced by the gettering layer. It is an inherent property of the gettering multilayer that the recrystallization process results in decrease of both the tensile stress in the first layer and the compressive stress in the second layer so that the resulting residual stress is kept essentially constant close to a zero value. The recrystallization process does not result in increase of the wafer warpage during device manufacturing processes.

Figure 10:
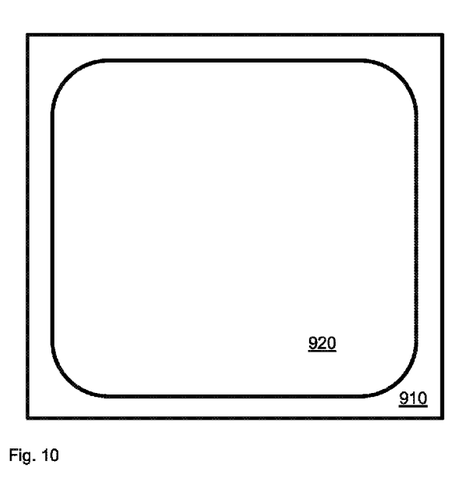
FIG. 10 illustrates a semiconductor device 920 formed on a wafer including the gettering structure of at least one exemplary embodiment.

FIG. 10 illustrates a semiconductor device 920 formed on and/or in a wafer 910, which can include a gettering structure in accordance with at least one exemplary embodiment. Wafer 910 can include multiple semiconductor devices that are not shown for simplicity of the drawing.

At least one exemplary embodiment is directed to a multilayer semiconductor gettering structure comprising: a first layer (e.g., 330), where the first layer has a first final stress type (e.g., tensile stress); and a second layer (e.g., 340), where the second layer has a second final stress type (e.g., compressive stress), where the first and second layers form a gettering structure, where the first final stress type is at least one of a tensile stress and a compressive stress, and where the second final stress type is at least one of a compressive stress and a tensile stress, where the first final stress type is not equal to the second final stress type.

At least one exemplary embodiment is directed to a semiconductor wafer comprising: a substrate; and a gettering structure, where the gettering structure is deposited onto the substrate, where the gettering layer comprises: a first layer, where the first layer is an amorphous layer that has a first stress type and a first thickness; and a second layer, where the second layer is a polycrystalline layer that has a second stress type and a second thickness, where when the second layer is deposited upon the first layer the amorphous layer crystallizes changing the first stress type to a first final stress type, where first final stress type is different than the second stress type, where a residual stress value of the wafer is a function of the stress values in the individual layers and of the ratio of the first thickness to the second thickness.

In at least one exemplary embodiment the residual stress of the wafer is a function of first layer stress value and second layer stress value ratio simultaneously. One can fix the deposition conditions and use the thickness ratio of the multiple layers, or one can fix the thickness ratio and control residual stress by changing stress value of the various layers (e.g., of the individual layers for example layer 3 of a multiple layer structure with three or more layers,). In the non-limiting examples discussed, one can retain a fixed thickness ratio between the first and second layer and change the stress value of the second (polycrystalline) layer, where the stress in polycrystalline layer can strongly depend on deposition temperature.

In at least one exemplary embodiment the first final stress type is tensile and the second stress type is compressive.

In at least one exemplary embodiment the gettering capability of the gettering structure is greater than or equal to the gettering capability of a single polysilicon layer of the same thickness as the structure.

At least one exemplary embodiment is directed to a method of semiconductor wafer warpage control comprising: providing a substrate; depositing an amorphous layer on the substrate at a first temperature and a first pressure, where the amorphous layer has a first layer stress value; and depositing a polysilicon on the amorphous layer at a second temperature and a second pressure, where the polysilicon has a second layer stress value, where upon depositing the polysilicon layer the amorphous layer crystallizes changing the first layer stress value to a new first layer stress value, where the new first layer stress value and the second layer stress value combine to form a residual stress value. In at least one further exemplary embodiment the new first layer is a tensile stress value, and where the second layer stress value is a compressive stress value.

In at least one exemplary embodiment the warpage of the wafer is controlled by the ratio of the thickness of the first layer to the thickness of the second layer, where the ratio has a value from about 0.05 to about 2.0.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions. For example, if words such as "orthogonal", "perpendicular" are used the intended meaning is "substantially orthogonal" and "substantially perpendicular" respectively. Additionally although specific numbers may be quoted in the claims, it is intended that a number close to the one stated is also within the intended scope, i.e. any stated number (e.g., 90 degrees) should be interpreted to be "about" the value of the stated number (e.g., about 90 degrees).

Thus, the description of the invention is merely exemplary in nature and, thus, variations that do not depart from the gist of the invention are intended to be within the scope of the exemplary embodiments of the present invention. Such variations are not to be regarded as a departure from the spirit and scope of the present invention.

What is claimed is:

1. A method for gettering a semiconductor wafer comprising:
   providing a semiconductor substrate having a first major surface and an opposed second major surface, the first major surface configured for forming semiconductor devices;
   depositing an amorphous layer on the second major surface at a first temperature and a first pressure, where the amorphous layer has a first layer stress value;
   depositing a polysilicon layer on the amorphous layer at a second temperature and a second pressure, where the polysilicon layer has a second layer stress value, where upon depositing the polysilicon layer the amorphous layer crystallizes changing the first layer stress value to a new first layer stress value, where the new first layer stress value is a tensile stress value, and the second layer stress value is a compressive stress value; the new first layer stress value and the second layer stress value combine to form a gettering structure having a residual stress value configured to reduce warpage of the semiconductor wafer; and
   exposing the semiconductor wafer to an elevated temperature to getter unwanted impurities away from a region proximate to the first major surface towards the second major surface.

2. The method according to claim 1, where the warpage of the semiconductor wafer is controlled by the ratio of a thickness of the first layer to a thickness of the second layer, where the ratio has a value from about 0.05 to about 2.0, and where the method further comprises removing the gettering structure after the exposing step.

3. A method for gettering a semiconductor substrate having reduced warpage comprising:
   providing a semiconductor substrate having a first surface and an opposed second surface, the first surface configured for forming semiconductor devices;
   forming a first layer on the second surface of the semiconductor substrate, where forming the first layer comprises forming the first layer having an amorphous structure and a first initial stress type; forming a second layer overlying the first layer to form a gettering structure, where forming the second layer comprises forming the second layer having polycrystalline structure and a second stress type, at least a first portion of the first layer structure changes to polycrystalline during the formation of the second layer onto the first layer, and where forming the second layer changes the first initial stress type to a first final stress type, and where the first final stress type is at least one of a tensile stress and a compressive stress, and where the second stress type is at least one of a compressive stress and a tensile stress, where the first final stress type is not equal to the second stress type; and
   exposing the semiconductor substrate to an elevated temperature to getter unwanted impurities in the semiconductor towards the second surface.

4. The method according to claim 3, where forming the second layer comprises depositing the second layer onto the first layer.

5. The method according to claim 4, where depositing the second layer onto the first layer changes the first initial stress type to the first final stress type.

6. The method according to claim 3, where the first initial stress type is compressive stress and the first final stress type is tensile stress.

7. The method according to claim 3, where forming the first layer comprises forming the first layer having a first stress value, and where forming the second layer comprises forming the second layer having a second stress value, and where the first stress value and the second stress value combine to form a residual stress value, where the residual stress value controls a warpage of the semiconductor substrate.

8. The method according to claim 7, where forming the first layer comprises forming the first layer having a first thickness, and where forming the second layer comprises forming the second layer having a second thickness, and where the ratio of the first thickness to the second thickness determines the residual stress value.

9. The method according to claim 8, where the ratio has a value from about 0.05 to about 10.0.

10. The method according to claim 9, where the ratio has value from about 0.05 to about 2.0.

11. The method according to claim 3, where forming the first layer comprises depositing the first layer at a temperature from about 520° C. to about 600° C. at a first pressure.

12. The method according to claim 11, where the first pressure has a value from about 10 mTorr to about 300 mTorr.

13. The method according to claim 12, where forming the second layer comprises depositing the second layer at a temperature from about 585° C. to about 700° C. at a second pressure.

14. The method according to claim 13, where the second pressure has a value from about 10 mTorr to about 300 mTorr.

15. A method for gettering a semiconductor wafer comprising:
  providing a substrate having a first surface and an opposed second surface, the first surface configured for forming semiconductor device structures;
  forming a first layer on the second surface of the substrate, where the first layer comprises an amorphous layer having a first initial stress type and a first thickness;
  forming a second layer overlying the first layer, where the second layer comprises a polycrystalline layer having a second stress type and a second thickness to form a gettering structure having a residual stress value that is a function of at least one of the ratio of the first thickness to the second thickness and stress value of the first layer to stress value of the second layer, where forming the second layer changes the first initial stress type to a first final stress type, where first final stress type is different than the second stress type; and
  exposing the semiconductor wafer to an elevated temperature to getter unwanted impurities in the semiconductor wafer.

16. The method of claim 15, where the ratio has a value from about 0.05 to about 2.0.

\* \* \* \* \*